United States Patent
Goeoetz et al.

(10) Patent No.: US 9,318,727 B2
(45) Date of Patent: Apr. 19, 2016

(54) ORGANIC LIGHT-EMITTING DEVICE HAVING A MATRIX MATERIAL EMBEDDED WITH HEAT CONDUCTING PARTICLES

(71) Applicant: OSRAM Opto Semiconductors Gmbh, Regensburg (DE)

(72) Inventors: Britta Goeoetz, Regensburg (DE); Christian Kristukat, Buenos Aires (AR); Martin Wittmann, Zeitlarn (DE); Benjamin Krummacher, Regensburg (DE); Karsten Diekmann, Rattenberg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/371,743

(22) PCT Filed: Jan. 7, 2013

(86) PCT No.: PCT/EP2013/050138
§ 371 (c)(1),
(2) Date: Jul. 11, 2014

(87) PCT Pub. No.: WO2013/104574
PCT Pub. Date: Jul. 18, 2013

(65) Prior Publication Data
US 2014/0374726 A1   Dec. 25, 2014

(30) Foreign Application Priority Data
Jan. 13, 2012   (DE) .......................... 10 2012 200485

(51) Int. Cl.
*H01L 51/52* (2006.01)
*H01L 51/56* (2006.01)

(52) U.S. Cl.
CPC .......... *H01L 51/529* (2013.01); *H01L 51/5237* (2013.01); *H01L 51/56* (2013.01)

(58) Field of Classification Search
CPC .... H01L 51/529; H01L 51/5237; H01L 51/56
See application file for complete search history.

(56) References Cited

U.S. PATENT DOCUMENTS 5,304,435 A * 4/1994 Jones ........................... 429/101
5,886,763 A * 3/1999 Wolkowicz ....... G02F 1/133382
                                                     349/161

(Continued)

FOREIGN PATENT DOCUMENTS

CN     1416006 A     5/2003
CN   101027941 A     8/2007

(Continued)

OTHER PUBLICATIONS

International Search Report issued for PCT/EP2013/050138 on Jun. 19, 2013.

(Continued)

*Primary Examiner* — Ida M Soward
(74) *Attorney, Agent, or Firm* — Viering, Jentschura & Partner mbB

(57) ABSTRACT

Various embodiments relates to an organic light-emitting device, including at least one functional layer for generating electroluminescent radiation, an encapsulation structure formed on or over the at least one functional layer, and a heat conduction layer formed on or over the encapsulation structure. The heat conduction layer includes a matrix material and heat conducting particles embedded in the matrix material.

13 Claims, 2 Drawing Sheets

(56) References Cited

U.S. PATENT DOCUMENTS

| | | | |
|---|---|---|---|
| 6,246,035 B1* | 6/2001 | Okuda | 219/619 |
| 7,109,520 B2 | 9/2006 | Yu et al. | |
| 7,118,900 B2* | 10/2006 | Seul | G03F 7/164 204/469 |
| 7,205,718 B2 | 4/2007 | Cok | |
| 7,927,706 B2* | 4/2011 | Fisher | B32B 17/10 252/583 |
| 8,629,603 B2 | 1/2014 | Baisl | |
| 2003/0085654 A1 | 5/2003 | Hayashi | |
| 2004/0004436 A1 | 1/2004 | Yoneda | |
| 2004/0085019 A1 | 5/2004 | Su et al. | |
| 2005/0184662 A1 | 8/2005 | Cok et al. | |
| 2005/0285520 A1 | 12/2005 | Cok | |
| 2006/0034729 A1* | 2/2006 | Poponin | G01N 21/658 422/82.05 |
| 2006/0068447 A1* | 3/2006 | Banerjee | G03F 7/164 435/7.2 |
| 2008/0012477 A1* | 1/2008 | Koo et al. | 313/504 |
| 2008/0038871 A1 | 2/2008 | Chiu et al. | |
| 2008/0054795 A1 | 3/2008 | Ohmi et al. | |
| 2010/0172101 A1* | 7/2010 | Yao et al. | 361/704 |
| 2010/0294362 A1* | 11/2010 | Christ et al. | 136/259 |
| 2011/0018416 A1 | 1/2011 | Sassa | |
| 2011/0100955 A1 | 5/2011 | Pushparaj et al. | |
| 2011/0204506 A1* | 8/2011 | Gurrum et al. | 257/690 |
| 2011/0290538 A1* | 12/2011 | Han et al. | 174/254 |
| 2012/0006885 A1* | 1/2012 | Chiu et al. | 228/208 |
| 2012/0068594 A1* | 3/2012 | Ibbetson et al. | 313/501 |
| 2012/0145315 A1* | 6/2012 | Knaapila | B82Y 30/00 156/273.9 |
| 2013/0071651 A1* | 3/2013 | Hakuta | B32B 17/1044 428/333 |
| 2013/0207148 A1* | 8/2013 | Krauter et al. | 257/98 |
| 2013/0242368 A1* | 9/2013 | Ofir | C09J 133/08 359/241 |
| 2014/0345843 A1* | 11/2014 | Kirkor et al. | 165/185 |
| 2015/0144190 A1* | 5/2015 | Moslehi | H01L 31/022441 136/256 |

FOREIGN PATENT DOCUMENTS

| | | |
|---|---|---|
| CN | 101106156 A | 1/2008 |
| DE | 102009054742 A1 | 6/2011 |
| TW | 200603670 A | 1/2006 |
| WO | 2004105071 A1 | 12/2004 |
| WO | 2010131156 A1 | 11/2010 |

OTHER PUBLICATIONS

Chinese Office Action based on Application No. 201380005479.1 (9 Pages And 5 Pages of English translation) dated Oct. 8, 2015 (Reference Purpose Only).

* cited by examiner

ORGANIC LIGHT-EMITTING DEVICE HAVING A MATRIX MATERIAL EMBEDDED WITH HEAT CONDUCTING PARTICLES

RELATED APPLICATIONS

The present application is a national stage entry according to 35 U.S.C. §371 of PCT application No.: PCT/EP2013/050138 filed on Jan. 7, 2013, which claims priority from German application No.: 10 2012 200 485.8 filed on Jan. 13, 2012, and is incorporated herein by reference in its entirety.

TECHNICAL FIELD

Various embodiments relate to an organic light-emitting device and to a method for processing an organic light-emitting device.

BACKGROUND

An organic light-emitting device, for example an organic light-emitting diode (OLED), is a luminescent radiator with which electromagnetic radiation is generated from electrical energy. An OLED generally includes at least one organic functional layer, in which the electromagnetic radiation is produced. The at least one functional layer is usually arranged between an anode and a cathode. When an on-state potential is applied, the anode injects holes into the active layer, while the cathode injects electrons. The injected holes and electrons respectively migrate (under the effect of an externally applied electric field) to the oppositely charged electrode and, by recombination in the functional layer, generate electroluminescent emission.

An OLED has, inter alia, the advantage that it can be used as a large-surface homogeneous light source. In large-surface OLEDs, however, a significant nonuniform distribution of temperature and luminous density often occurs. This is the case, in particular, when busbars are not used for the current distribution, and when the contacting is on one side. Owing to the nonuniform distribution, a nonuniform light pattern is created with brightness peaks and temperature peaks. These can also lead to increased ageing of the OLED.

SUMMARY

Various embodiments provide an organic light-emitting device in which an inhomogeneous temperature distribution is reduced or avoided.

Various embodiments provide an organic light-emitting device and a method for processing an organic light-emitting device.

Various embodiments are described herein in connection with devices, and various embodiments are described in connection with methods. The embodiments and configurations described in connection with the devices also apply accordingly, insofar as is expedient, for the methods, and vice versa.

The embodiments and configurations described herein do not necessarily exclude one another. Rather, one or more embodiments and/or configurations may be combined with one another in order to form new embodiments or configurations.

According to various embodiments, a heat conduction layer (in other words, a heat conducting or heat distributing layer (also referred to as a thermally conductive layer)) is formed on or over an encapsulation (for example thin-layer encapsulation or encapsulation with glass lamination) of an organic light-emitting device (for example an OLED) in order to uniformly distribute heat which is generated by a functional layer or a functional layer stack of the light-emitting device during operation of the device, and thereby to achieve a more uniform temperature distribution and luminous density.

According to one embodiment, an organic light-emitting device includes: at least one functional layer for generating electroluminescent radiation; an encapsulation structure formed on or over the at least one functional layer; a heat conduction layer formed on or over the encapsulation structure, the heat conduction layer including a matrix material and heat conducting particles (also referred to as thermally conductive particles) embedded in the matrix material.

According to another embodiment, a method for processing an organic light-emitting device includes: provision of an organic light-emitting device, which includes at least one functional layer for generating electroluminescent radiation and an encapsulation structure formed on or over the at least one functional layer; formation of a heat conduction layer on or over the encapsulation structure, the heat conduction layer including a matrix material and heat conducting particles embedded in the matrix material.

The terms "arranged on one another", "formed on one another" and "applied on a layer" as used here mean, for example, that a first layer is arranged immediately in direct mechanical and/or electrical contact on a second layer. A first layer may also be arranged indirectly on a second layer, in which case further layers may be present between the first layer and the second layer.

The terms "arranged over one another", "formed over one another" and "applied over a layer" as used here mean, for example, that a first layer is arranged at least indirectly on a second layer. That is to say, further layers may be present between the first layer and the second layer.

In the context of this application, a "functional layer" of the organic light-emitting device (for example the OLED) is intended to mean a layer which is used for charge transport and for light generation in the organic light-emitting device.

According to one configuration, the at least one functional layer of the organic light-emitting device is formed as an organic functional layer.

An "organic functional layer" may contain emitter layers, for example including fluorescent and/or phosphorescent emitters.

The functional layer may be part of a functional layer stack of the organic light-emitting device, which includes a plurality of functional layers (for example organic functional layers).

According to various configurations, the organic light-emitting device may include a first electrode (for example a cathode) and a second electrode (for example an anode), and the functional layer (or the functional layer stack) may be formed between the first electrode and the second electrode.

The term "particles" as used here may mean solid particles whose dimensions (for example diameter) lie in the micrometer range, for example particles having an average diameter in the range of from a few micrometers according to various configurations, for example particles having an average diameter in the range of from approximately 1 µm to approximately 5 µm according to one configuration.

According to another configuration, the heat conducting particles include a material having a high thermal conductivity or consist of a material having a high thermal conductivity, for example a material having a thermal conductivity of at least 200 W/(m·K) according to one configuration, for example a material having a thermal conductivity of at least 500 W/(m·K) according to one configuration.

According to another configuration, the heat conducting particles include at least one metal or consist of at least one metal. Heat conducting particles which consist of at least one metal may also be referred to as metal particles.

According to another configuration, the heat conducting particles include one or more of the following metals or consist of one or more of the following metals: silver, copper, gold, aluminum. Heat conducting particles which consist of silver may also be referred to as silver particles. Heat conducting particles which consist of copper may also be referred to as copper particles. Heat conducting particles which consist of gold may also be referred to as gold particles. Heat conducting particles which consist of aluminum may also be referred to as aluminum particles.

According to another configuration, the heat conducting particles include silicon or a conductive silicon compound (for example silicon carbide). The heat conducting particles may, for example, consist of one or more of the aforementioned materials. Heat conducting particles which consist of silicon may also be referred to as silicon particles. Heat conducting particles which consist of silicon carbide may also be referred to as silicon carbide particles.

According to another configuration, the heat conducting particles include carbon or a conductive carbon modification (for example graphite, diamond, or carbon nanotubes (CNTs)) or carbon compound, or consist thereof. Heat conducting particles which consist of graphite may also be referred to as graphite particles. Heat conducting particles which consist of diamond may also be referred to as diamond particles.

According to another configuration, the heat conducting particles include a metal oxide (for example aluminum oxide ($Al_2O_3$)) and/or a metal salt. The heat conducting particles may, for example, consist of one or more of the aforementioned materials. Heat conducting particles which consist of a metal oxide (for example aluminum oxide) may also be referred to as metal oxide particles (for example aluminum oxide particles). Heat conducting particles which consist of a metal salt may also be referred to as metal salt particles.

According to other configurations, the heat conducting particles may include other suitable heat conducting materials or consist thereof.

According to another configuration, all the heat conducting particles include the same material or consist thereof.

According to another configuration, the heat conducting particles include different materials or consist of different materials. In other words, one part of the heat conducting particles may include a different material or consist thereof than one or more other parts of the heat conducting particles. Expressed in yet another way, a first part of the heat conducting particles may include a first material or consist thereof and a second part of the heat conducting particles, different to the first part, may include a second material different to the first material, or consist thereof.

According to various configurations, the matrix material is different to the material or materials of the heat conducting particles embedded therein.

According to another configuration, the matrix material includes a curable material, for example a thermally curable material or a material which can be cured by means of exposure to light (for example exposure to UV light). As a thermally curing material, for example, a material may be used which cures at low temperatures, for example at a temperature in the range of from approximately 50° C. to approximately 90° C., for example in the range of from approximately 50° C. to approximately 80° C. according to one configuration, for example in the range of from approximately 50° C. to approximately 70° C. according to one configuration.

According to another configuration, the matrix material includes an adhesive material or is an adhesive material (also referred to as adhesive or glue), for example an epoxy adhesive, an acrylate adhesive, a silicone adhesive, and/or a thermally and/or UV curing adhesive (for example thermally and/or UV curing two-component adhesive) (that is to say an adhesive which can be cured by heating or exposure to UV radiation).

As an alternative or in addition, other suitable adhesive materials may be used.

According to another configuration, the heat conduction layer is formed directly on the encapsulation structure.

According to another configuration, a layer for reducing the reflectivity and/or improving the emissivity is formed on or over the heat conduction layer, for example a nonreflective sheet, for example a black sheet according to one configuration, or a black (for example matt black) coating layer according to another configuration, or a black layer obtained by anodization according to yet another configuration.

According to another configuration, the layer for reducing the reflectivity and/or improving the emissivity may have a rib pattern. According to an alternative configuration, as an alternative or in addition to the layer which is used for reducing the reflectivity and/or improving the emissivity, a layer (for example a sheet) having a rib pattern may be formed on or over the heat conduction layer. The ribs of the rib pattern may clearly be used as cooling ribs, in order to dissipate the distributed heat to the surroundings.

According to another configuration, as an alternative or in addition to a minimally reflective surface or the use of cooling ribs for the heat dissipation, the applied heat conduction layer or layers or heat distributing layer or layers may be connected to a housing of the organic light-emitting device (for example an OLED) or to a heat sink, for example a cooling body.

According to another configuration, the heat conduction layer covers the encapsulation structure over its entire surface. It is, however, also possible for the heat conduction layer to cover only a part or parts of the encapsulation structure.

According to another configuration, the encapsulation structure is formed as thin-layer encapsulation. As an alternative, the encapsulation structure may also include glass lamination or be formed as glass lamination.

"Thin-layer encapsulation" (also referred to as "thin-film encapsulation") may, for example, mean a layer or a layer structure which is suitable for forming a barrier against chemical contamination or atmospheric substances, in particular against water (moisture) and/or oxygen. In other words, thin-layer encapsulation is formed in such a way that it cannot be penetrated by atmospheric substances, such as water or oxygen, or can at most be penetrated thereby in very small amounts. The barrier effect in the case of thin-layer encapsulation is essentially achieved by one or more thin layers which are part of the thin-layer encapsulation. The layer or the individual layers of the thin-layer encapsulation may, for example, have a thickness of less than or equal to a few hundreds of nm.

According to one configuration, the thin-layer encapsulation consists of the layer or layers which is or are responsible for the barrier effect of the thin-layer encapsulation. This layer or these layers may also be referred to as barrier thin layer(s) or barrier thin film(s).

According to another configuration, the thin-layer encapsulation may be formed as a single layer (in other words as one layer).

According to another configuration, the thin-layer encapsulation may include a multiplicity of sublayers formed on one another. In other words, according to one configuration the thin-layer encapsulation may be formed as a layer stack which includes a multiplicity of sublayers (also referred to as barrier thin layers).

The thin-layer encapsulation, or one or more sublayers (barrier thin layers) of the thin-layer encapsulation may, for example, be formed by means of a suitable deposition method, for example by means of an atomic layer deposition (ALD) method according to one configuration, for example a plasma enhanced atomic layer deposition (PEALD) method or a plasmaless atomic layer deposition (PLALD) method, or by means of a chemical vapor deposition (CVD) method according to another configuration, for example a plasma enhanced chemical vapor deposition (PECVD) method or a plasmaless chemical vapor disposition (PLCVD) method, or alternatively by means of other suitable deposition methods.

By using an atomic layer deposition (ALD) method, very thin layers can be deposited. In particular, layers whose layer thicknesses lie in the atomic layer range may be deposited.

According to another configuration, in thin-layer encapsulation which includes a plurality of sublayers, all the sublayers may be formed by means of an atomic layer deposition method. A layer sequence which only includes ALD layers may also be referred to as a "nanolaminate".

According to another configuration, in thin-layer encapsulation which includes a plurality of sublayers, one or more sublayers of the thin-layer encapsulation may be deposited by a deposition method other than an atomic layer deposition method, for example by means of a chemical vapor deposition (CVD) method.

According to another configuration, the thin-layer encapsulation may have a layer thickness of from approximately 1 nm to approximately 10 µm, for example a layer thickness of from approximately 30 nm to approximately 1 µm according to one configuration, for example a layer thickness of from approximately 300 nm to approximately 600 nm according to one configuration, for example approximately 450 nm according to one configuration.

According to another configuration in which the thin-layer encapsulation includes a plurality of sublayers, all the sublayers may have the same layer thickness. According to another configuration, the individual sublayers of the thin-layer encapsulation may have different layer thicknesses. In other words, at least one of the sublayers may have a different layer thickness than one or more of the other sublayers.

A layer (or sublayer), deposited by means of an atomic layer deposition method (ALD method), of the thin-layer encapsulation may, for example, have a layer thickness in the range of from approximately 1 nm to approximately 1000 nm, for example a layer thickness of from approximately 10 nm to approximately 100 nm according to one configuration, for example approximately 50 nm according to one configuration.

A layer (or sublayer), deposited by means of a chemical vapor deposition method (CVD method), of the thin-layer encapsulation may, for example, have a layer thickness in the range of from approximately 10 nm to approximately 10 µm, for example a layer thickness of from approximately 30 nm to approximately 1 µm according to one configuration, for example a layer thickness of from approximately 100 nm to approximately 500 nm according to one configuration, for example approximately 400 nm according to one configuration.

The layer or the individual sublayers of the thin-layer encapsulation may respectively include a material which is suitable for protecting the functional layer or layers of the organic light-emitting device against damaging effects of the surroundings, i.e. for instance against oxygen and/or moisture.

For example, the thin-layer encapsulation or (in the case of a layer stack having a multiplicity of sublayers) one or more of the sublayers of the thin-layer encapsulation may include one of the following materials or consist thereof: an oxide, a nitride or an oxynitride in crystalline or vitreous form. The oxide, nitride or oxynitride may for example furthermore include aluminum, silicon, tin, zinc, titanium, zirconium, tantalum, niobium or hafnium. The layer or the individual sublayers may for example include silicon oxide ($SiO_x$), for instance $SiO_2$, silicon nitride ($Si_xN_y$), for instance $Si_2N_3$, aluminum oxide, for instance $Al_2O_3$, aluminum nitride, tin oxide, indium tin oxide, zinc oxide, aluminum zinc oxide, titanium oxide, zirconium oxide, hafnium oxide or tantalum oxide.

According to another configuration, thin-layer encapsulation which includes a plurality of sublayers, all the sublayers may include the same material or consist thereof. According to another configuration, the individual sublayers of the thin-layer encapsulation may include different materials or consist thereof. In other words, at least one of the sublayers may include a different material, or consist thereof, than one or more of the sublayers other.

According to another configuration, the thin-layer encapsulation may end with an adhesive layer or a glass lamination. In other words, according to one configuration, an adhesive layer or a glass lamination may optionally be formed between the thin-layer encapsulation and the heat conduction layer.

According to another configuration, the heat conduction layer has a layer thickness in the range of from approximately 100 µm to approximately 2 mm according to one configuration, for example a layer thickness in the range of from approximately 200 µm to approximately 500 µm according to one configuration. According to other configurations, the layer thickness may have a different value.

According to another configuration, the organic light-emitting device furthermore includes at least one additional heat conduction layer, which is formed on or over the heat conduction layer. The at least one additional heat conduction layer may be configured in a similar way as the heat conduction layer, for example according to one or more of the configurations described herein in connection with the heat conduction layer.

The at least one additional heat conduction layer may have a different material composition (that is to say a different matrix material and/or a different material for heat conducting particles embedded therein) than the heat conduction layer. As an alternative, the at least one additional heat conduction layer may have the same material composition as the heat conduction layer.

The at least one additional heat conduction layer may have a different layer thickness than the heat conduction layer (for example being thicker or thinner than the heat conduction layer). As an alternative, the at least one additional heat conduction layer may have the same layer thickness as the heat conduction layer.

According to another configuration, the organic light-emitting device is configured as an organic light-emitting diode (OLED).

According to another embodiment, an organic light-emitting device includes: at least one functional layer for generating electroluminescent radiation; an encapsulation structure formed on or over the at least one active layer; a heat conduction layer formed on or over the encapsulation structure, the heat conduction layer having been formed by evaporation (also known as thermal evaporation) and/or sputtering (also known as cathode sputtering) and/or plasma deposition (in other words, a plasma enhanced deposition process) and/or spraying (in other words deposition by means of a spray method, for example cold spraying) and/or aerosol deposition of at least one heat conducting material.

According to another embodiment, a method for processing an organic light-emitting device includes: provision of an organic light-emitting device, which includes at least one functional layer for generating electroluminescent radiation and an encapsulation structure formed on or over the at least one active layer; formation of a heat conduction layer on or over the encapsulation structure, the heat conduction layer being formed by means of evaporation and/or sputtering and/or plasma deposition and/or spraying (in other words, deposition by means of a spray method, for example cold spraying) and/or aerosol deposition of at least one heat conducting material.

According to one configuration, the at least one heat conducting material includes a material having a high thermal conductivity or is a material having a high thermal conductivity, for example a material having a thermal conductivity of at least 200 W/(m·K) according to one configuration, for example a material having a thermal conductivity of at least 500 W/(m·K) according to one configuration.

According to another configuration, the at least one heat conducting material includes metal or is metal.

According to another configuration, the at least one heat conducting material includes one or more of the following metals or is one of the following metals: silver, copper, gold, aluminum.

According to another configuration, the at least one heat conducting material includes carbon or a conductive carbon modification (for example graphite of diamond) or carbon compound, or is one of the aforementioned materials.

According to another configuration, the at least one heat conducting material includes silicon or a conductive silicon compound (for example silicon carbide) or is one of the aforementioned materials.

According to another configuration, the heat conduction layer is formed directly on the encapsulation structure.

According to another configuration, a layer for reducing the reflectivity and/or improving the emissivity is formed on or over the heat conduction layer.

According to another configuration, the layer for reducing the reflectivity and/or improving the emissivity includes a nonreflective sheet.

According to another configuration, the heat conduction layer covers the encapsulation structure over its entire surface. It is, however, also possible for the heat conduction layer to cover only a part or parts of the encapsulation structure.

According to another configuration, the encapsulation structure is formed as thin-layer encapsulation. As an alternative, the encapsulation structure may also include glass lamination or be formed as glass lamination.

According to another configuration, the heat conduction layer has a layer thickness in the range of from approximately 100 μm to approximately 2 mm, for example a layer thickness in the range of from approximately 200 μm to approximately 500 μm according to another configuration. According to other configurations, the layer thickness may have a different value.

According to another configuration, the organic light-emitting device furthermore includes at least one additional heat conduction layer, which is formed on or over the heat conduction layer. The at least one additional heat conduction layer may be configured in a similar way as the heat conduction layer, for example according to one or more of the configurations described herein in connection with the heat conduction layer.

The at least one additional heat conduction layer may include a different material or consist of a different material than the heat conduction layer. As an alternative, the at least one additional heat conduction layer may include the same material or consist of the same material as the heat conduction layer.

The at least one additional heat conduction layer may have a different layer thickness than the heat conduction layer (for example being thicker or thinner than the heat conduction layer). As an alternative, the at least one additional heat conduction layer may have the same layer thickness as the heat conduction layer.

According to another configuration, the organic light-emitting device is configured as an organic light-emitting diode.

According to various embodiments, flat (for example large-surface) organic light-emitting devices (for example large-surface OLEDs) may be provided, which distribute the heat, which is generated by one or more light-generating functional layers, uniformly over the surface of the organic light-emitting device and therefore have a more uniform temperature distribution. A more uniform temperature distribution can improve the homogeneity of the light pattern and the lifetime of the device (device lifetime). For example, further elements which can finally dissipate the heat may be attached to the distribution layer.

In conventional designs, the heat has not previously been specifically distributed. At most, busbars which ensure a more uniform current distribution have been resorted to in the design, with the result that the temperature distribution is also more homogeneous. Furthermore, care has been taken to contact the OLED as uniformly as possible and, in non-square or non-round designs, the anode (less conductive) is contacted on the longer side.

In comparison with OLEDs without a device for temperature distribution, in an organic light-emitting device (for example an OLED) according to various embodiments there is homogenization of the temperature and/or an improvement of the luminous density distribution and/or an improvement of the lifetime. Furthermore, by virtue of these improvements, designs which for example contain fewer busbars, and which are less favorable in terms of thermal technology in terms of the connections, are also made accessible.

Conventionally, the temperature distribution could also be improved by conventional cooling bodies, although these are much thicker and therefore counteract the particular thinness and flatness which are an outstanding feature of OLEDs.

According to some embodiments, a heat conduction layer is applied on an encapsulation structure (for example thin-layer encapsulation, although other encapsulations such as for example glass laminations are also possible) of an organic light-emitting device (for example an OLED), which uniformly distributes the heat generated during operation by horizontal thermal conduction. In this way, it is possible to avoid local temperature peaks which could otherwise lead to increased ageing at the relevant positions. By virtue of the regularization of the temperature over the component surface, the luminous density can be at least partially homogenized, thermally induced differences can be compensated for, and the component can be based on locally isothermal characteristics.

According to some embodiments, thermally conductive particles, for example graphite, carbon nanotubes (CNTs) or metal particles (for example silver particles) are applied onto an encapsulated organic light-emitting device, (for example an OLED). Since these particles generally cannot be evaporated, according to various configurations they are mixed beforehand into a matrix material (for example an adhesive). The layer produced in this way is used for homogenization of the heat distribution.

In comparison with metal plates or sheets which are applied by means of a bonding layer (which in the normal case has only a poor thermal conductivity), with the introduction of thermally conductive particles the heat can be distributed directly on the encapsulation. In particular, in this way it is possible to use carbon nanotubes (CNTs) which have an extremely high thermal conductivity. The heat distributing layer therefore lies very close to the heat generating layer, and the distribution can therefore be carried out better than if the heat was first to be transported further outward.

According to some configurations, the heat distributing layer is configured in such a way that it is minimally reflective. According to many configurations, following the application of the heat distributing layer, a nonreflective layer (for example a nonreflective sheet or the like) may, for example, additionally be applied.

According to some embodiments, a heat conducting or heat distributing layer is applied on a thin-film encapsulation of an organic light-emitting device (for example an OLED) by means of evaporation or sputtering. For example, the layer may also be applied by means of a plasma process, by means of a spray method, for example cold spraying, or by means of an aerosol method (aerosol deposition). The fact that the evaporation or sputtering of the heat conducting layer takes place after the application of the thin-film encapsulation has, for example, the advantage that the organic light-emitting device (for example an OLED) already has a certain degree of protection by the encapsulation, for example a few hundreds of nm (in principle, an improvement of the thermal conductivity could also be achieved by using a much thicker cathode (with a thickness of for example 2 μm instead of 150 nm). This, however, can be carried out only with difficulty in terms of process technology: in the case of evaporation with a low evaporation rate, the residence time during the evaporation would be extremely long, and with a higher rate the OLED would be damaged by excessive heat input during the evaporation. Sputtering of the cathode can likewise damage the OLED). Owing to the application of the heat conducting or heat distributing layer on the thin-layer encapsulation, the heat conducting layer according to various embodiments lies very close to the heat generating layer, and the distribution can therefore take place in an improved way than if the heat was first to be transported further outward. Depending on the material which is used for the heat conducting layer, evaporation or sputtering may be more suitable, in order, for example, to apply a correspondingly thick layer as noninvasively as possible in the shortest possible time.

According to various configurations, the heat conducting layer is configured in such a way that it is minimally reflective. According to many configurations, following the application of the heat conducting layer, a nonreflective layer (for example a nonreflective sheet or the like) may, for example, additionally be applied.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings, which form a part of this description and in which specific embodiments, in which the disclosure can be implemented, are shown for illustration. In this regard, direction terminology such as "up", "down", "forward", "backward", "front", "rear", etc. is used with reference to the orientation of the figure or figures being described. Since components of embodiments can be positioned in a number of different orientations, the direction terminology is used only for illustration and is in no way restrictive. It is to be understood that other embodiments may be used and structural or logical modifications may be carried out, without departing from the protective scope of the present disclosure. It is to be understood that the features of the various exemplary embodiments described herein may be combined with one another, unless specifically indicated otherwise. The following detailed description is therefore not to be interpreted in a restrictive sense, and the protective scope of the present disclosure is defined by the appended claims.

In the scope of this description, terms such as "connected" or "coupled" are used to describe both direct and indirect connection, and direct or indirect coupling.

In the figures, elements which are identical or similar are provided with identical references, insofar as this is expedient.

Figure 1:
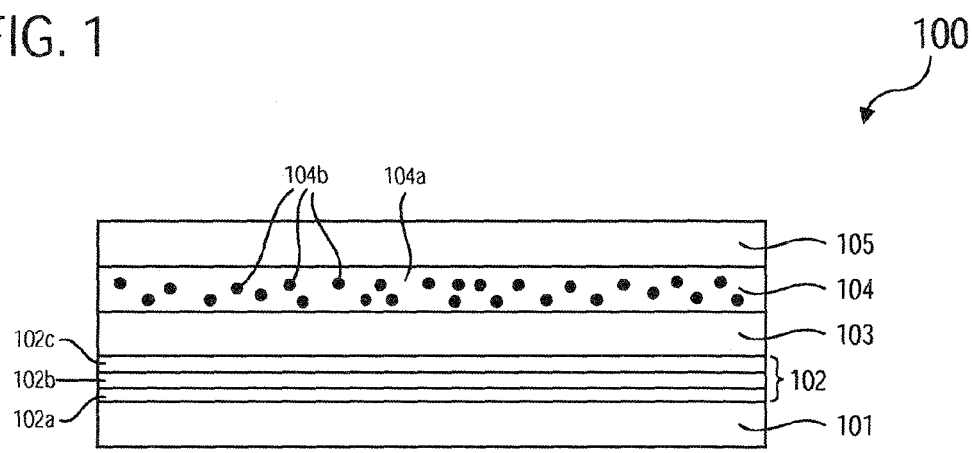
FIG. 1 shows an organic light-emitting device according to an embodiment.

FIG. 1 shows an organic light-emitting device 100 according to one embodiment as a schematic cross-sectional view. The organic light-emitting device 100 is formed as an OLED. As an alternative, the organic light-emitting device 100 may be a different organic light-emitting device.

The organic light-emitting device 100 includes a substrate 101.

The substrate 101 may for example be a transparent support, for example a glass or a sheet, for example a flexible plastic sheet. As an alternative, other suitable substrate materials may be used.

An OLED layer stack 102 is formed on the substrate 101. The OLED layer stack 102 is covered with an encapsulation structure 103 which in the embodiment shown is formed as thin-layer encapsulation. As an alternative, other encapsulation structures may also be used, for example encapsulation with glass lamination.

The OLED layer stack 102 includes one or more sublayers. For example, the OLED layer stack 102 may include a first electrode layer 102a (for example an anode layer), which is formed on the substrate 101. The first electrode layer 102a (for example an anode layer) may, for example, be electrically coupled (not shown) to a first electrode connection (for example an anode connection). The first electrode layer 102a (for example an anode layer) may be transparent and for example include a suitable transparent conductive material, for example a transparent conductive oxide (TCO), for example a transparent metal oxide such as, for example, indium tin oxide (ITO). As an alternative, the first electrode layer 102a (for example an anode layer) may include other suitable materials.

A functional layer stack including at least one organic functional layer 102b may be applied on the first electrode layer 102a (for example an anode layer) of the OLED stack 102. A second electrode layer 102c (for example a cathode layer) of the OLED stack 102 may be applied over of the functional layer stack including the at least one organic functional layer 102b. The second electrode layer 102c (for example a cathode layer) may, for example, be electrically coupled (not shown) to a second electrode connection (for example a cathode connection).

The functional layer stack may include one or a multiplicity of organic functional layers 102b. At least, an active layer, in which emitted radiation is generated as soon as an electrical voltage is applied to the active layer, may be provided. The active layer may include an electroluminescent material. For example, the electroluminescent material may include suitable polymers for fluorescence or phosphorescent emission. As an alternative, small organic molecules, which emit by means of fluorescence or phosphorescence, may be used as an active layer (organic electroluminescent layer).

When an on-state potential is applied, the anode injects holes into the anode layer, while the cathode injects electrons into the cathode layer. The injected holes and electrons respectively migrate (under the effect of an externally applied electric field) to the oppositely charged electrode and, by recombination in the active layer, generate electroluminescent emission.

The delivery of the charge carriers may respectively take place via a charge transport layer. A charge transport layer arranged between the anode layer and the active layer is also referred to as a hole transport layer (HTL). It may, for example, include a p-doped conductive organic or inorganic material. A charge transport layer arranged between the cathode layer and the active layer is also referred to as an electron transport layer (ETL). It may, for example, include an n-doped conductive organic or inorganic material. For both charge transport layers, suitable intrinsic, i.e. undoped layers may also be used. The charge transport layers are likewise part of the functional layer stack.

In order to be able to apply an electric voltage to the functional layer stack, or to the active layer, the first electrode layer 102a (for example an anode layer) may be connected to the first electrode connection (for example an anode connection), and the second electrode layer 102c (for example a cathode layer) may be connected to the second electrode connection (for example a cathode connection). The first and second electrode connections may be connected to an energy source. For example, they may be coupled to a constant current source, and for example a battery or a driver circuit.

The first electrode layer 102a (for example an anode layer) and the second electrode layer 102c (for example a cathode layer) are used as an electrical feed of charge carriers to the organic functional layer or layers, which is or are arranged between the cathode and the anode.

During the recombination of charge carriers in the active layer of the functional layer stack, and owing to ohmic resistances in the electrical feeds, heat is produced inside the organic light-emitting device 100. This is particularly detrimental for the materials in the organic functional layer or layers 102b of the OLED layer stack 102. The materials used there are generally organic molecules or organic macromolecules (polymers). These can be degraded by thermal effects, and in particular processes such as dissociation can take place. Those organic materials which are used in the production of an OLED may be modified by the effect of temperature both in molecular structure and in material structure (for example by (re)crystallization, glass transitions, etc.), so that different optical properties may be induced, for example in terms of the emission spectra or the refractive index.

In large-surface organic light-emitting devices (for example large-surface OLEDs), a nonuniform distribution of temperature and luminous density may furthermore occur, so that a nonuniform light pattern can be created with brightness peaks and temperature peaks.

In the embodiment shown, a heat conduction layer 104 is provided, which is formed on the encapsulation 103 and is used to uniformly distribute the heat produced so that brightness peaks and temperature peaks can be avoided. To this end, the heat conduction layer 104 includes thermally conductive particles 104b which are embedded in a matrix material 104a.

The thermally conductive particles 104b may include a material having a high thermal conductivity or consist thereof, for example a material having a thermal conductivity of at least 200 W/(m·K) according to one configuration, for example a material having a thermal conductivity of at least 500 W/(m·K) according to one configuration.

According to one configuration, for example, the thermally conductive particles 104b include a metal or consist of a metal, for example silver, copper, gold or aluminum.

According to another configuration, the thermally conductive particles 104b may, for example, include silicon or consist thereof.

According to another configuration, the heat conducting particles 104b may, for example, include silicon carbide or consist thereof.

According to another configuration, the thermally conductive particles 104b may, for example, include a carbon-based material, for example graphite, diamond and/or carbon nanotubes (CNTs) or consist thereof.

According to another configuration, the thermally conductive particles 104b may, for example, include a metal oxide, for example aluminum oxide ($Al_2O_3$), and/or a metal salt.

According to one configuration, the thermally conductive particles 104b may all include the same material, or consist thereof. According to another configuration, the thermally conductive particles 104b may include different materials or consist of different materials. In other words, one part of the thermally conductive particles 104b may include a different material or consist thereof than one or more other parts of the thermally conductive particles 104b. Expressed in yet another way, a first part of the thermally conductive particles 104b may include a first material or consist thereof and a second part of the thermally conductive particles 104b, different to the first part, may include a second material different to the first material, or consist thereof.

The matrix material 104a may for example be an adhesive, for example an epoxy adhesive, an acrylate adhesive, a silicone adhesive, a thermally and/or UV curing adhesive (for example a thermally and/or UV curing two-component adhesive), or any other suitable adhesive. As an alternative, other suitable materials in which the thermally conductive particles 104b can be embedded may be used as a matrix material 104a of the heat conduction layer 104.

According to one configuration, the organic light-emitting device 100 may optionally include a layer 105 for reducing the reflectivity and/or improving the emissivity, formed on the heat conduction layer 104, as shown in FIG. 1. The layer 105 may for example be a nonreflective sheet, for example a black sheet, or a black (for example matt black) coating layer or a black layer obtained by anodization. As an alternative, the layer 105 may be another suitable layer, which is suitable for reducing the reflectivity and/or improving the emissivity.

The heat conduction layer 104 may follow on directly from the encapsulation structure 103, as shown. In other words, the heat conduction layer 104 may be applied directly on the encapsulation structure 103. As an alternative, one or more additional layers (not shown), for example a protective layer according to one configuration, may be formed between the encapsulation structure 103 (for example thin-layer encapsulation) and the heat conduction layer 104.

According to another configuration, at least one additional heat conduction layer (not shown) may be formed on the heat conduction layer 104. The at least one additional heat conduction layer may be configured in a similar way as the heat conduction layer 104, for example according to one or more of the configurations described herein in connection with the heat conduction layer 104. The layer 105 (if present) may in this case be formed on the at least one additional heat conduction layer. Clearly, a layer stack including a multiplicity of heat conduction layers formed on one another may be applied on the encapsulation structure 103, and the layer 105 (if present) may be formed on the layer stack.

Figure 2:
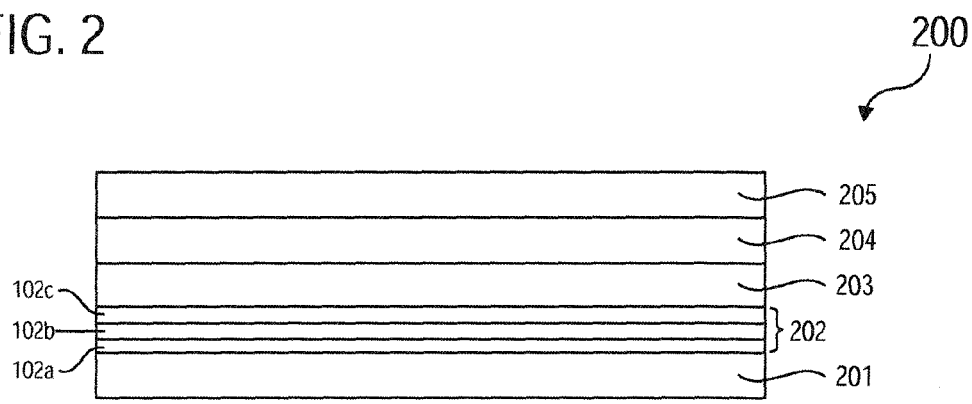
FIG. 2 shows an organic light-emitting device according to another embodiment.

FIG. 2 shows an organic light-emitting device 200 according to another embodiment as a schematic cross-sectional view. The organic light-emitting device 200 is formed as an OLED. As an alternative, the organic light-emitting device 200 may be a different organic light-emitting device.

The organic light-emitting device 200 includes a substrate 201, an OLED layer stack 202 formed on the substrate 201 and an encapsulation structure 203, which is formed on the OLED layer stack 202 and is formed as thin-layer encapsulation (as an alternative, the encapsulation structure 203 may also be a different encapsulation, for example encapsulation with glass lamination).

The substrate 201, the OLED layer stack 202 and the encapsulation structure or thin-layer encapsulation 203 may, for example, be configured according to one or more of the configurations described herein, for example in a similar way as the substrate 101, the OLED layer stack 102 and the encapsulation structure 103, which were described above in connection with FIG. 1.

In the embodiment shown, a heat conduction layer 204 is provided, which is formed on the encapsulation 203 and is used to uniformly distribute the heat produced so that brightness peaks and temperature peaks can be avoided.

To this end, heat conduction layer 204 includes at least one heat conducting material, or consists of at least one heat conducting material, which can be applied or deposited on the encapsulation structure 203 by means of evaporation and/or sputtering and/or plasma deposition and/or spraying and/or aerosol deposition.

The at least one heat conducting material may have a high thermal conductivity, for example a thermal conductivity, for example a material having a thermal conductivity of at least 200 W/(m·K) according to one configuration, for example a thermal conductivity of at least 500 W/(m·K) according to another configuration.

As materials with a high thermal conductivity, which can be evaporated or sputtered, metals may for example be used. In particular, for example, silver, copper, gold and aluminum have very high thermal conductivities and may therefore be used advantageously as material for the heat conduction layer 204.

According to one configuration, the heat conduction layer 204 may for example be an evaporated aluminum layer, for example (but not exclusively) if the encapsulation structure 203 is thin-layer encapsulation which terminates with aluminum. According to another configuration, the heat conduction layer 204 may be a sputtered aluminum layer. Particularly good adhesion/connection to the thin-film-encapsulated layer can be obtained by virtue of the sputtered ions. In a similar way, according to other configurations, the heat conduction layer 204 may for example be an evaporated or sputtered silver layer, or an evaporated or sputtered copper layer, or an evaporated or sputtered gold layer.

According to other configurations, as an alternative or in addition, other suitable materials, which have a thermal conductivity that is as high as possible and can be applied by means of evaporation or sputtering, may be used for the heat conduction layer 204.

As materials with a high thermal conductivity, which can be applied or deposited by a plasma process, diamond or silicon carbide may for example be used. In other words, the heat conduction layer 204 may for example be formed as a diamond layer or a silicon carbide layer, which have respectively been applied by means of a plasma enhanced deposition process. According to other configurations, as an alternative or in addition, other suitable materials, which have a thermal conductivity that is as high as possible and can be applied by means of plasma deposition, may be used for the heat conduction layer 204.

According to one configuration, the organic light-emitting device 200 may optionally include a layer 205 for reducing the reflectivity and/or improving the emissivity, formed on the heat conduction layer 204, as shown in FIG. 2. The layer 205 may for example be a nonreflective sheet, for example a black sheet, or a black (for example matt black) coating layer or a black layer obtained by anodization. As an alternative, the layer 205 may be another suitable layer, which is suitable for reducing the reflectivity and/or improving the emissivity.

The heat conduction layer 204 may follow on directly from the encapsulation structure 203, as shown. In other words, the heat conduction layer 204 may be applied directly on the encapsulation structure 203. As an alternative, one or more additional layers (not shown), for example a protective layer according to one configuration, may be formed between the encapsulation structure 203 (for example thin-layer encapsulation) and the heat conduction layer 204.

Figure 3:
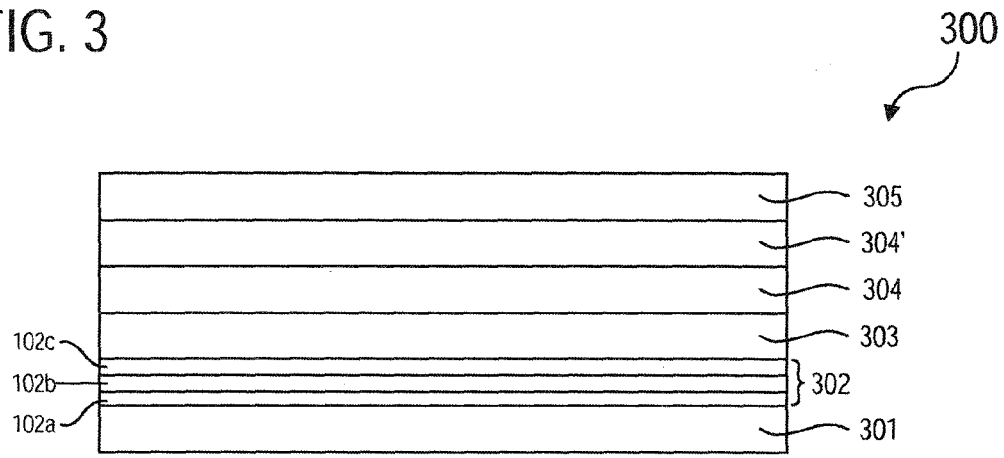
FIG. 3 shows an organic light-emitting device according to another embodiment.

According to another configuration, at least one additional heat conduction layer may be formed on the heat conduction layer 204, as shown for example in FIG. 3.

FIG. 3 shows an organic light-emitting device 300 according to another embodiment as a schematic cross-sectional view. The organic light-emitting device 300 is formed as an OLED. As an alternative, the organic light-emitting device 300 may also be a different organic light-emitting device.

The organic light-emitting device 300 includes a substrate 301, an OLED layer stack 302 formed on the substrate 301 and an encapsulation structure 303, which is formed on the OLED layer stack 302 and is formed as thin-layer encapsulation (as an alternative, the encapsulation structure 303 may also be a different encapsulation, for example encapsulation with glass lamination), and a heat conduction layer 304 formed on the encapsulation structure 303.

The substrate 301, the OLED layer stack 302, the encapsulation structure or thin-layer encapsulation 303 and the heat conduction layer 304 may, for example, be configured according to one or more of the configurations described herein, for example in a similar way as the substrate 201, the OLED layer stack 202, the encapsulation structure 203 and the heat conduction layer 204, which were described above in connection with FIG. 2.

The organic light-emitting device 300 differs from the organic light-emitting device 200 shown in FIG. 2 in that an additional heat conduction layer 304' is formed on the heat conduction layer 304. The additional heat conduction layer 304' may, like the heat conduction layer 304, have been formed by means of evaporation, sputtering or plasma deposition of at least one heat conducting material. As heat conducting materials for the additional heat conduction layer 304', for example, one or more materials which may also be used for the heat conduction layer 304 may be used, for example metals with a thermal conductivity which is as high as possible, for example silver, copper, gold, aluminum, or diamond or silicon carbide, or other suitable heat conducting materials which can be applied by evaporation and/or sputtering and/or by plasma deposition and/or spray methods and/or aerosol methods.

According to one configuration, the heat conduction layer 304 may for example be an evaporated or sputtered aluminum layer and the additional heat conduction layer 304' may be a sputtered silver layer. In other words, according to this configuration, the heat conduction layer 304 may be formed first by means of evaporation or sputtering of aluminum, and the additional heat conduction layer 304' may subsequently be formed by means of sputtering of silver. Silver can generally be sputtered at faster rates than it can be evaporated. A thick layer can therefore be generated more easily, and the thermal conductivity of silver is much higher than that of aluminum.

According to another configuration, the heat conduction layer 304 may for example be an evaporated or sputtered silver layer, and the additional heat conduction layer 304' may be an evaporated or sputtered aluminum layer. In other words, according to this configuration, the heat conduction layer 304 may be formed first by means of evaporation or sputtering of silver, and the additional heat conduction layer 304' may subsequently be formed by means of evaporation or sputtering of aluminum.

According to one configuration, the organic light-emitting device 300 may optionally include a layer 305 for reducing the reflectivity and/or improving the emissivity, formed on the additional heat conduction layer 304', as shown in FIG. 3. The layer 305 may for example be a nonreflective sheet, for example a black sheet, or a black (for example matt black) coating layer, or a black layer obtained by anodization. As an alternative, the layer 305 may be another suitable layer, which is suitable for reducing the reflectivity and/or improving the emissivity.

Figure 4:
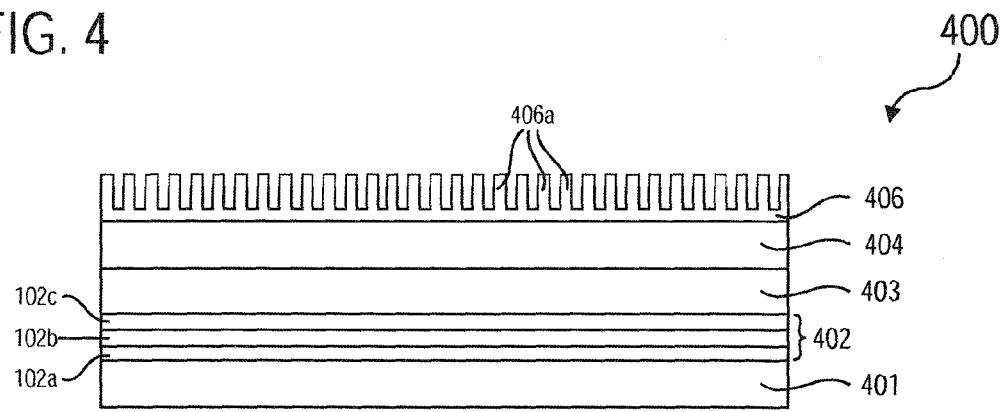
FIG. 4 shows an organic light-emitting device according to another embodiment.

FIG. 4 shows an organic light-emitting device 400 according to another embodiment as a schematic cross-sectional view. The organic light-emitting device 400 is formed as an OLED. As an alternative, the organic light-emitting device 400 may be a different organic light-emitting device.

The organic light-emitting device 400 includes a substrate 401, an OLED layer stack 402 formed on the substrate 401 and an encapsulation structure 403, which is formed on the OLED layer stack 402 and is formed as thin-layer encapsulation (as an alternative, the encapsulation structure 403 may also be a different encapsulation, for example encapsulation with glass lamination), and a heat conduction layer 404 formed on the encapsulation structure 403.

The substrate 401, the OLED layer stack 402, the encapsulation structure or thin-layer encapsulation 403 and the heat conduction layer 404 may, for example, be configured according to one or more of the configurations described herein, for example in a similar way as was described with reference to FIG. 1 to FIG. 3.

The organic light-emitting device 400 furthermore includes a layer 406 having a rib pattern, which is formed on the heat conduction layer 404. The rib pattern includes a multiplicity of ribs 406a. The ribs 406a may clearly be used as cooling ribs for heat dissipation.

According to another configuration, the layer 406 may be configured as a nonreflective layer for reducing the reflectivity and/or improving the emissivity. As an alternative, according to another configuration, an additional layer for reducing the reflectivity and/or improving the emissivity may be formed between the heat conduction layer 404 and the layer 406.

LIST OF REFERENCES 100, 200, 300, 400 organic light-emitting device
101, 201, 301, 401 substrate
102, 102, 302, 402 OLED layer stack
102a first electrode layer
102b organic functional layer
102c second electrode layer
103, 203, 303, 403 encapsulation structure
104, 204, 304, 404 heat conduction layer
104a matrix material
104b heat conducting particles
105, 205, 305 reflectively-reducing layer
304' additional heat conduction layer
406 rib pattern layer
406a rib

The invention claimed is:

1. An organic light-emitting device, comprising:
    at least one functional layer for generating electroluminescent radiation;
    a glass encapsulation structure formed on or over the at least one functional layer; and
    a heat conduction layer formed on or over the glass encapsulation structure, the heat conduction layer comprising a matrix material and heat conducting particles embedded in the matrix material.

2. The organic light-emitting device as claimed in claim 1, wherein the heat conducting particles comprise a material having a thermal conductivity of at least 200 W/(m·K).

3. The organic light-emitting device as claimed in claim 1, wherein the heat conducting particles comprise at least one of
    a metal;
    carbon or a conductive carbon modification or carbon compound;
    silicon or a conductive silicon compound;
    a metal oxide; and
    a metal salt.

4. The organic light-emitting device as claimed in claim 1, wherein the heat conductive particles comprise carbon nanotubes.

5. The organic light-emitting device as claimed in claim 1, wherein the matrix material comprises an adhesive material.

6. The organic light-emitting device as claimed in claim 1, wherein the heat conduction layer is formed directly on the glass encapsulation structure.

7. The organic light-emitting device as claimed in claim 1, further comprising a layer for reducing the reflectivity and/or improving the emissivity, which is formed on or over the heat conduction layer.

8. The organic light-emitting device as claimed in claim 1, wherein the glass encapsulation structure is formed as thin-layer encapsulation.

9. The organic light-emitting device as claimed in claim 1, further comprising a layer having a rib pattern, which is formed on or over the heat conduction layer.

10. The organic light-emitting device as claimed in claim 1, wherein the heat conduction layer has a thickness in the range of from approximately 100 μm to approximately 2 mm.

11. The organic light-emitting device as claimed in claim 1, further comprising at least one additional heat conduction layer, which is formed on or over the heat conduction layer.

12. The organic light-emitting device as claimed in claim 1, wherein the heat conduction layer covers the glass encapsulation structure over its entire surface.

13. The organic light-emitting device as claimed in claim 1, configured as an organic light-emitting diode.

* * * * *